United States Patent
Yin et al.

(10) Patent No.: US 9,627,036 B2
(45) Date of Patent: Apr. 18, 2017

(54) STATIC RANDOM ACCESS MEMORY LAYOUT STRUCTURE

(71) Applicant: UNITED MICROELECTRONICS CORP., Hsin-Chu (TW)

(72) Inventors: Tan-Ya Yin, Nantou County (TW); Ming-Jui Chen, Hsinchu (TW); Chia-Wei Huang, Kaohsiung (TW); Yu-Cheng Tung, Kaohsiung (TW); Chin-Sheng Yang, Hsinchu (TW)

(73) Assignee: UNITED MICROELECTRONICS CORP., Hsin-Chu, Taiwan (TW)

( * ) Notice: Subject to any disclaimer, the term of this patent is extended or adjusted under 35 U.S.C. 154(b) by 0 days.

(21) Appl. No.: 14/822,911

(22) Filed: Aug. 11, 2015

(65) Prior Publication Data
US 2017/0018302 A1   Jan. 19, 2017

(30) Foreign Application Priority Data
Jul. 15, 2015 (TW) .............................. 104122843 A (51) Int. Cl.
| | |
|---|---|
| H01L 21/28 | (2006.01) |
| H01L 23/535 | (2006.01) |
| H01L 27/11 | (2006.01) |
| H01L 29/66 | (2006.01) |
| G11C 11/412 | (2006.01) |
| H01L 27/02 | (2006.01) |

(52) U.S. Cl.
CPC ........ *G11C 11/412* (2013.01); *H01L 27/0207* (2013.01); *H01L 27/1104* (2013.01)

(58) Field of Classification Search
CPC ................. H01L 23/5226; H01L 2924/01078
See application file for complete search history.

(56) References Cited

U.S. PATENT DOCUMENTS

| | | | |
|---|---|---|---|
| 8,964,453 B2 | 2/2015 | Lin | |
| 8,964,455 B2 | 2/2015 | Liaw | |
| 2008/0253170 A1* | 10/2008 | Inaba | .................... G11C 11/412 |
| | | | 365/154 |
| 2009/0059640 A1* | 3/2009 | Funane | .................... G11C 8/16 |
| | | | 365/51 |
| 2013/0181297 A1 | 7/2013 | Liaw | |
| 2013/0258759 A1 | 10/2013 | Liaw | |
| 2013/0272056 A1* | 10/2013 | Liaw | ........................ G11C 8/14 |
| | | | 365/154 |

(Continued)

OTHER PUBLICATIONS

Hsu, Title of Invention: Static Random Access Memory, U.S. Appl. No. 14/724,775, filed May 28, 2015.

*Primary Examiner* — Dale E Page
*Assistant Examiner* — Long Le
(74) *Attorney, Agent, or Firm* — Winston Hsu; Scott Margo (57) ABSTRACT

A static random access memory unit structure and layout structure includes two pull-up transistors, two pull-down transistors, two slot contact plugs, and two metal-zero interconnects. Each metal-zero interconnect is disposed on each slot contact plug and a gate of each pull-up transistor, in which, each slot contact plug crosses a drain of each pull-down transistor and a drain of each pull-up transistor and extends to cross an end of each metal-zero interconnect. A gap between the slot contact plugs is smaller than a gap between the metal-zero interconnects.

10 Claims, 3 Drawing Sheets

(56) References Cited

U.S. PATENT DOCUMENTS

| | | |
|---|---|---|
| 2013/0329480 A1 | 12/2013 | Sato |
| 2014/0035056 A1 | 2/2014 | Liaw |
| 2014/0241027 A1 | 8/2014 | Hung |
| 2015/0137262 A1* | 5/2015 | Baek .................. H01L 27/0207 257/401 |

* cited by examiner

STATIC RANDOM ACCESS MEMORY LAYOUT STRUCTURE

BACKGROUND OF THE INVENTION

1. Field of the Invention

The present invention relates to a static random access memory unit structure and a static random access memory layout structure.

2. Description of the Prior Art

The static random access memory (SRAM) has been applied to electronic devices, such as a notebook, a portable device or a video game console, because of having fast access speed and low power consumption. In a conventional SRAM, positions of slot contact plugs electrically connected to sources and drains of fin field-effect transistors (FINFETs) respectively, positions of gate lines of the FINFETs and positions of metal-zero interconnects disposed on the slot contact plugs and the gate lines may have different relations between them according different designs. Especially, a part of the slot contact plugs and a part of the gate lines should be electrically connected to each other through the metal-zero interconnects. However, with the reduction of the size of the device, the widths of the slot contact plugs, not only the widths of the gate lines and the widths of the metal-zero interconnects are narrowed, but also the contact areas between the metal-zero interconnects and the slot contact plugs and between the metal-zero interconnects and the gate lines will be decreased by the affection of the alignment accuracy of manufacturing process and the affection of the layout structure, thereby increasing the electrical resistance from the FINFETs to the outsides.

SUMMARY OF THE INVENTION

One objective of the present invention is to provide a static random access memory unit structure and layout structure to reduce the resistance of the resistor for connecting the transistors to the outside and to more densely arrange the transistors.

According to an embodiment of the present invention, a static random access memory unit structure is provided. The static random access memory unit structure includes a first inverter, a second inverter, a first slot contact plug, a first metal-zero interconnect, a second slot contact plug, and a second metal-zero interconnect. The first inverter includes a first pull-down transistor and a first pull-up transistor; the second inverter includes a second pull-down transistor and a second pull-up transistor; the first slot contact plug crosses a drain of the first pull-down transistor and a drain of the first pull-up transistor; the first metal-zero interconnect is disposed on the first slot contact plug and a gate of the second pull-up transistor, wherein the first slot contact plug extends to cross an end of the first metal-zero interconnect; the second metal-zero interconnect crosses a drain of the second pull-down transistor and a drain of the second pull-up transistor, wherein the first slot contact plug and the second slot contact plug have a first gap therebetween, the drain of the first pull-up transistor and the drain of the second pull-up transistor have a second gap therebetween, and the first gap is smaller than the second gap; and the second metal-zero interconnect is disposed on the second slot contact plug and a gate of the first pull-up transistor, wherein the second slot contact plug extends to cross an end of the second metal-zero interconnect, and the first metal-zero interconnect and the second metal-zero interconnect have a third gap therebetween, and the first gap is smaller than the third gap.

According to another embodiment of the present invention, a static random access memory layout structure is provided, which includes a semiconductor substrate, including a first active region extending along a first direction, a second active region extending along the first direction, a third active region extending along the first direction, and a fourth active region extending along the first direction, wherein the first active region, the second active region, the third active region and the fourth active region sequentially arranged along a second direction; a first gate line crossing the first active region and the second active region and extending to cover an end of the third active region; a second gate line crossing the third active region and the fourth active region and extending to cover an end of the second active region, wherein the first gate line and the second gate line extend along the second direction respectively and are parallel to each other; a first slot contact plug disposed between the first gate line and the second gate line and crossing the first active region and the second active region; a second slot contact plug disposed between the first gate line and the second gate line and crossing the third active region and the fourth active region, wherein the first slot contact plug and the second slot contact plug are arranged along the second direction and disposed between the first gate line and the second gate line, wherein the first slot contact plug and the second slot contact plug have a first gap therebetween and the second active region and the third active region have a second gap therebetween, and the first gap is smaller than the second gap; a first metal-zero interconnect disposed on the first slot contact plug and the second gate line and electrically connecting the first slot contact plug to the second gate line, wherein the first slot contact plug extends to cross an end of the first metal-zero interconnect; and a second metal-zero interconnect disposed on the second slot contact plug and the first gate line and electrically connecting the second slot contact plug to the first gate line, wherein the second slot contact plug extends to cross an end of the second metal-zero interconnect, the first metal-zero interconnect and the second metal-zero interconnect have a third gap therebetween, and the first gap is smaller than the third gap.

In the SRAM unit structure and layout structure, the gap between any two of the metal-zero interconnects of the metal-zero layer near each other in the first direction can be reduced to be smaller than the gap between the gate lines adjacent to each other and arranged in the first direction. Also, the slot contact plugs cross the metal-zero interconnects connected thereto. Accordingly, the contact areas between the metal-zero interconnects and the gate lines and the contact areas between the slot contact plugs and the metal-zero interconnects can be increased. Therefore, the resistance of the route for electrically connecting each transistor to another corresponding transistor can be decreased, and the SRAM units near each other can be arranged more densely.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
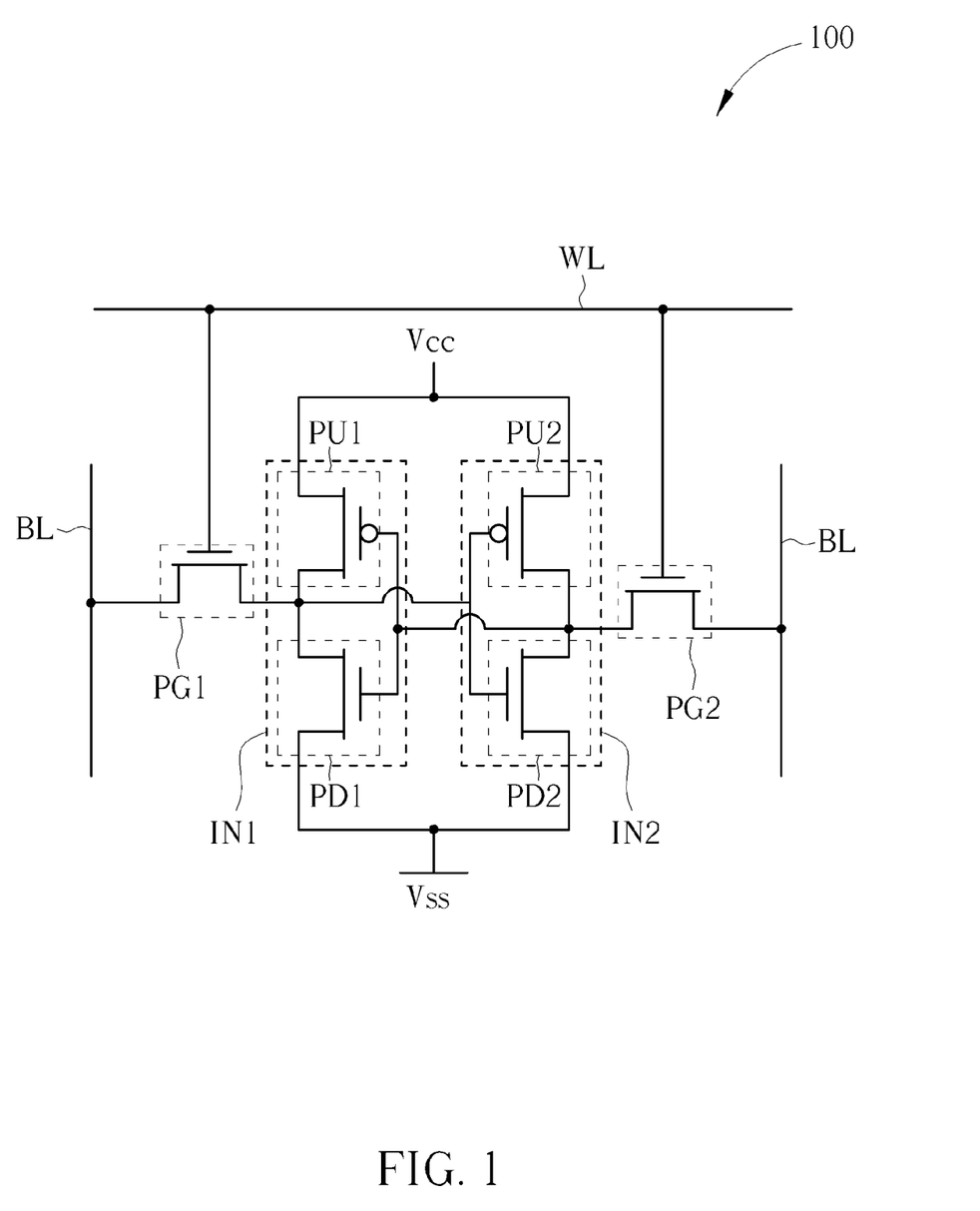
FIG. 1 is a schematic diagram illustrating a circuit of a static random access memory unit according to an embodiment of the present invention.

Refer to FIG. 1, which is a schematic diagram illustrating a circuit of a static random access memory (SRAM) unit according to an embodiment of the present invention. As shown in FIG. 1, the SRAM unit 100 is a six-transistor SRAM (6T-SRAM), which includes a first inverter IN1, a second inverter IN2, a first pass-gate transistor PG1 and a second pass-gate transistor PG2.

In this embodiment, the first inverter IN1 includes a first pull-up transistor PU1 and a first pull-down transistor PD1, and the second inverter IN2 includes a second pull-up transistor PU2 and a second pull-down transistor PD2. The first pull-up transistor PU1 and the second pull-up transistor PU2 are p-type field effect transistor (pFET), such as p-type metal-oxide-semiconductor field effect transistor (PMOSFET), and the first pull-down transistor PD1 and the second pull-down transistor PD2 are n-type FET (nFET), such as n-type metal-oxide-semiconductor field effect transistor (NMOSFET). A drain and a gate of the first pull-up transistor PU1 are electrically connected to a drain and a gate of the first pull-down transistor PD1 respectively, so that the first pull-up transistor PU1 and the first pull-down transistor PD1 constitute the first inverter IN1. Also, a source of the first pull-up transistor PU1 is electrically connected to a high power line Vcc, such as a voltage power source, and a source of the first pull-down transistor PD1 is electrically connected to a low power line Vss, such as ground. Likewise, a drain and a gate of the second pull-up transistor PU2 are electrically connected to a drain and a gate of the second pull-down transistor PD2 respectively, so that the second pull-up transistor PU2 and the second pull-down transistor PD2 constitute the second inverter IN2. Also, a source of the second pull-up transistor PU2 and a source of the second pull-down transistor PD2 are electrically connected to the high power line Vcc and the low power line Vss respectively. Furthermore, a drain of the first pass-gate transistor PG1 is electrically connected to an output of the first inverter IN1 that is the drain of the first pull-up transistor PU1 and the drain of the first pull-down transistor PD1 and an input of the second inverter IN2 that is the gate of the second pull-up transistor PU2 and the gate of the second pull-down transistor PD2. Likewise, a drain is electrically connected to an output of the second inverter IN2 which is the drain of the second pull-up transistor PU2 and the drain of the second pull-down transistor PD2 and an input of the first inverter IN1 that is the gate of the first pull-up transistor PU1 and the gate of the first pull-down transistor PD1. As well, a gate of the first pass-gate transistor PG1 and a gate of the second pass-gate transistor PG2 are electrically connected to a word line WL, and a source of the first pass-gate transistor PG1 and a source of the second pass-gate transistor PG2 are electrically connected to corresponding bit lines BL respectively.

Figure 2:
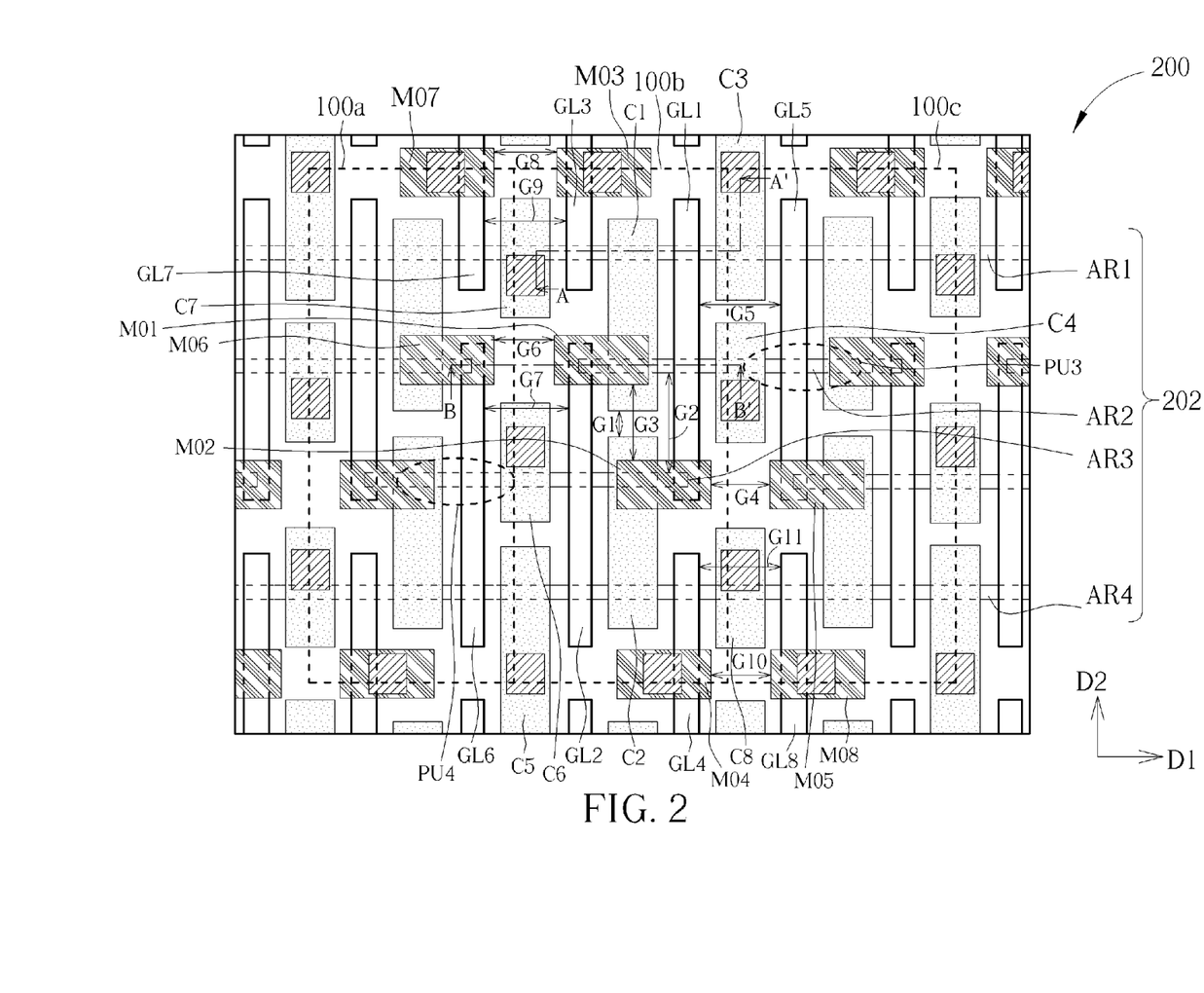
FIG. 2 is a schematic diagram illustrating a top view of a SRAM layout structure according an embodiment of the present invention.
Figure 3:
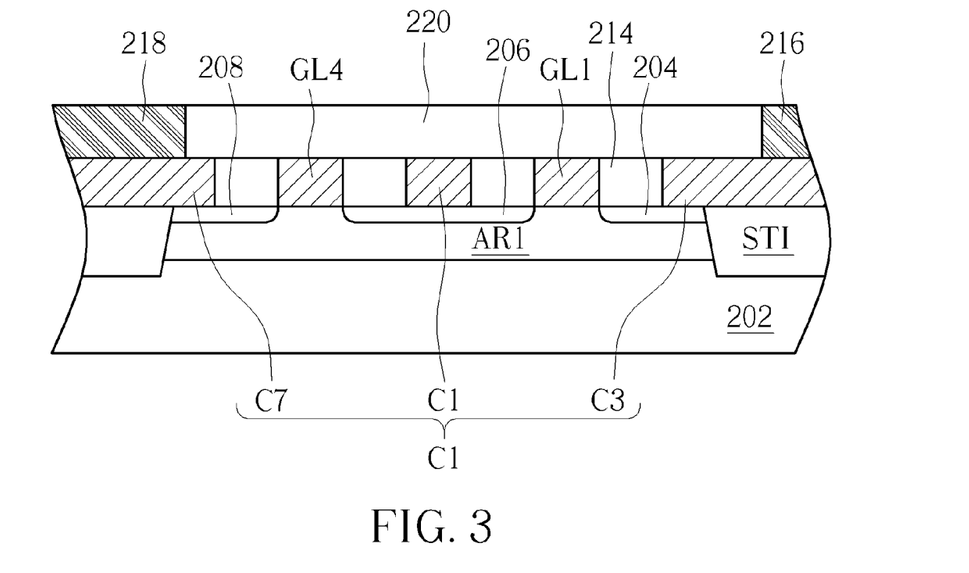
FIG. 3 is a schematic diagram illustrating a cross-sectional view of FIG. 2 taken along a cross-sectional line A-A'.
Figure 4:
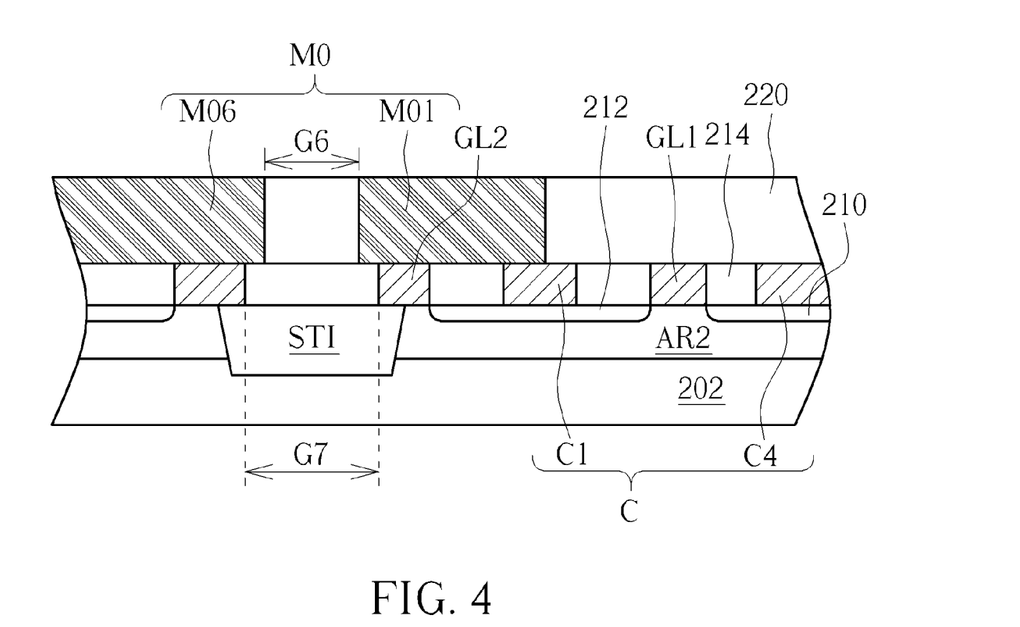
FIG. 4 is a schematic diagram illustrating a cross-sectional view of FIG. 2 taken along a cross-sectional line B-B'.

Refer to FIGS. 2-4 together with FIG. 1. FIG. 2 is a schematic diagram illustrating a top view of a SRAM layout structure according an embodiment of the present invention, FIG. 3 is a schematic diagram illustrating a cross-sectional view of FIG. 2 taken along a cross-sectional line A-A', and FIG. 4 is a schematic diagram illustrating a cross-sectional view of FIG. 2 taken along a cross-sectional line B-B'. As shown in FIGS. 1-4, the SRAM layout structure 200 includes a plurality of SRAM unit structure. In order to clearly show each SRAM unit structure, FIG. 2 shows only one SRAM unit structure, but not limited thereto. In this embodiment, the SRAM unit structure may include at least three SRAM units 100 which are a first SRAM unit 100a, a second SRAM unit 100b and a third SRAM unit 100c sequentially arranged along a first direction D1. Any two of the SRAM units 100 near each other are symmetric to each other with respect to a second direction D2 different from the first direction D1.

For clarity, the following description takes the second SRAM unit 100b as an example, but not limited thereto. Specifically, the second SRAM unit 100b includes a semiconductor substrate 202, a first gate line GL1, and a second gate line GL2. The semiconductor substrate 202 includes a first active region AR1, a second active region AR2, a third active region AR3, and a fourth active region AR4, protruded from a top surface of the semiconductor substrate 202. The first, second, third and fourth active regions AR1, AR2, AR3, AR4 are parallel to each other and extend along the first direction D1 respectively. The first, second, third and fourth active regions AR1, AR2, AR3, AR4 are stripe-shaped fin structures and are sequentially arranged along the second direction D2. Accordingly, transistors formed by the first, second, third and fourth active regions AR1, AR2, AR3, AR4 can be fin field-effect transistors (FINFETs) respectively, in which the first active region AR1 and the fourth active region AR4 are symmetric to each other with respect to the first direction D1, and the second active region AR2 and the third active region AR3 are symmetric to each other with respect to a center of the second SRAM unit 100b. The second active region AR2 and the third active region AR3 have a first conductivity type, and the first active region AR1 and the fourth active region AR4 have a second conductivity type different from the first conductivity type. In this embodiment, the first conductivity type is N-type, and the second conductivity type is P-type, but is not limited thereto. An isolation, such as shallow trench isolation, may be disposed between any two of the active regions for electrically isolation.

The first gate line GL1 extends along the second direction D2 and crosses the first active region AR1 and the second active region AR2. Accordingly, the first gate line GL1 crossing the first active region AR1 can form the gate of the first pull-down transistor PD1, and the source and the drain of the first pull-down transistor PD1 are disposed in the first active region AR1 at two sides of the first gate line GL1 respectively. Also, the first gate line GL1 crossing the second active region AR2 can form the gate of the first pull-up transistor PU1, and the source and the drain of the first pull-up transistor PU1 are disposed in the second active region AR2 at two sides of the first gate line GL1. It should be noted that the first gate line GL1 extends to cover an end of the third active region AR3, thereby shielding the end of the third active region AR3, which providing a better quality when forming the drain of the second pull-up transistor PU2.

Similarly, since the structure of the second pull-down transistor PD2 and the second pull-up transistor PU2 is symmetric to the structure of the first pull-down transistor PD1 and the first pull-up transistor PU1, the second gate line GL2 extends along the second direction D2 and crosses the third active region AR3 and the fourth active region AR4. Accordingly, the second gate line GL2 crossing the fourth active region AR4 can form the gate of the second pull-down transistor PD2, and the source and the drain of the second pull-down transistor PD2 are disposed in the fourth active region AR4 at two sides of the second gate line GL2 respectively. Also, the second gate line GL2 crossing the third active region AR3 can form the gate of the second pull-up transistor PU2, and the source and the drain of the second pull-up transistor PU2 are disposed in the third active region AR3 at two sides of the second gate line GL2. It should be noted that the second gate line GL2 extends to cover an end of the second active region AR2, thereby shielding the end of the second active region AR2, which providing a better quality when forming the drain of the first pull-up transistor PU1.

Additionally, the SRAM layout structure 200 may further include a third gate line GL3 and a fourth gate line GL4 extending along the second direction D2 respectively. For densely arranging the structure, the third gate line GL3 and the second gate line GL2 are arranged along the second direction, and the fourth gate line GL4 and the first gate line GL1 are arranged along the second direction D2. In this arrangement, the third gate line GL3 crosses the first active region AR1 and forms the gate of the first pass-gate transistor PG1 which source and drain are disposed in the first active region AR1 at two sides of the third gate lines GL3 respectively. Since the drain of the first pass-gate transistor PG1 and the drain of the first pull-down transistor PD1 are formed by a same doped region, they can be electrically connected to each other. The fourth gate line GL4 crosses fourth active region AR4 and forms the gate of the second pass-gate transistor PG2 which source and drain are disposed in the fourth active region AR1 at two sides of the fourth gate lines GL4 respectively. Since the drain of the second pass-gate transistor PG2 and the drain of the second pull-down transistor PD2 are formed by a same doped region, they can be electrically connected to each other. In the present invention, the gate line represents a structure of a gate insulation layer and a gate conductive layer stacked sequentially, and preferably, includes spacers disposed on the sidewalls of the gate conductive layer and the gate insulation layer.

In this embodiment, the source of the first pull-down transistor PD1, the drains of the first pull-down transistor PD1 and the first pass-gate transistor PG1 and the source of the first pass-gate transistor PG1 can be formed by N-type doped regions 204, 206, 208 which are separated from each other and disposed in the first active region AR1 respectively, and likewise, the source of the second pull-down transistor PD2, the drains of the second pull-down transistor PD2 and the second pass-gate transistor PG2 and the source of the second pass-gate transistor PG2 also can be formed by N-type doped regions which are separated from each other and disposed in the fourth active region AR4 respectively. The source and drain of the first pull-up transistor PU1 are formed by P-type doped regions 210, 212 which are separated from each other and disposed in the second active region AR2 respectively. Likewise, the source and drain of the second pull-up transistor PU2 are formed by P-type doped regions which are separated from each other and disposed in the third active region AR3 respectively.

In order to provide a relative connection between the transistors, the SRAM layout structure 200 may further include a contact layer C and a first inter-layer dielectric layer 214 disposed on the semiconductor substrate 202. The contact layer C which is used to electrically connect the sources and the drains of the transistor with a corresponding connection is disposed in the through hole of the first inter-layer dielectric layer 214. In this embodiment, the contact layer C includes a first slot contact plug C1 and a second slot contact plug C2 which extend along the second direction D2 and are substantially arranged along the second direction D2. The slot contact plug which is disposed between the first gate line GL1 and the second gate line GL2 crosses and contacts the drain of the first pull-down transistor PD1 disposed in the first active region PU1 and the drain of the first pull-up transistor disposed in the second active region AR2 respectively, thereby electrically connecting the drain of the first pull-down transistor PD1 to the drain of the first pull-up transistor PU1. The second slot contact plug C2 which is disposed between the first gate line GL1 and the second gate line GL2 crosses and contacts the drain of the second pull-down transistor PD2 disposed in the fourth active region AR4 and the drain of the second pull-up transistor PU2 disposed in the third active region AR3 respectively, thereby electrically connecting the drain of the second pull-down transistor PD2 to the drain of the second pull-up transistor PU2. The first slot contact plug C1 and the second slot contact plug C2 have a first gap G1 therebetween, and the second active region AR2 and the third active region AR3 have a second gap G2, in which the first gap G1 is smaller than the second gap G2.

Furthermore, the contact layer may further include a third slot contact plug C3, a fourth slot contact plug C4, a fifth slot contact plug C5, a sixth slot contact plug C6, a seventh slot contact plug C7, and an eighth slot contact plug C8 extending along the second direction D2 respectively. The third slot contact plug C3 is disposed on the source of the first pull-down transistor PD1; that is, the third slot contact plug C3 crosses the first active region AR1 at a side of the first gate line GL1 opposite to another side of the first gate line GL1 facing the first slot contact plug C1. Also, the third slot contact plug C3 is electrically connected to the low power line Vss through a metal interconnect 216. The fourth slot contact plug C4 is disposed on the source of the first pull-up transistor PU1; that is, the fourth slot contact plug C4 crosses the second active region AR2 at the side of the first gate line GL1 opposite to the another side of the first gate line GL1 facing the first slot contact plug C1 and is electrically connected to the high power line Vcc through another metal interconnect 218. Likewise, the fifth slot contact plug C5 is disposed on the source of the second pull-down transistor PD2; that is, the fifth slot contact plug C5 crosses the fourth active region AR4 at a side of the second gate line GL2 opposite to another side of the second gate line GL2 facing the second slot contact plug C2, and is electrically connected to the low power line Vss through another metal interconnect. The sixth slot contact plug C6 is disposed on the source of the second pull-up transistor PU2; that is, the sixth slot contact plug C6 crosses the third active region AR3 at the side of the second gate line GL2 opposite to the another side of the second gate line GL2 facing the second slot contact plug C2 and is electrically connected to the high power line Vcc through another metal interconnect. The seventh slot contact plug C7 is disposed on the source of the first pass-gate transistor PG1; that is, the seventh slot contact plug C7 crosses the first active region AR1 at a side of the third gate line GL3 opposite to another side of the third gate line GL3 facing the first slot contact plug C1 and is electrically connected to a corresponding word line WL through another metal interconnect. The eighth slot contact plug C8 is disposed on the source of the second pass-gate transistor PG2; that is, the eighth slot contact plug C8 crosses the fourth active region AR4 at a side of the fourth gate line GL4 opposite to another side of the fourth gate line GL3 facing the second slot contact plug C2 and is electrically connected to a corresponding bit line BL through another metal interconnect. The third, fourth and eighth slot contact plugs C3, C4, C8 can substantially be arranged along the second direction D2, and also the fifth, sixth and the seventh slot contact plugs are arranged along the second direction D2.

It should be noted that the pattern of the contact layer C can be defined by various photomasks in combination with a double patterning process or a multiple patterning process; that is, a two-patterning-two-etching (2P2E) approach or a two-patterning-one-etching (2P1E) is used to form the first to eighth slot contact plugs C1-C8. As exemplified by the double patterning process, the first slot contact plug C1, the fifth slot contact plug C5, the seventh slot contact plug C7 and the fourth slot contact plug C4 which are arranged in the second direction and are not in contact with each other can be defined by a same photomask, and the second slot contact plug C2, the sixth slot contact plug C6, the third slot contact plug C3 and the eighth slot contact plug C8 can be defined by another photomask. Thus, the first gap G1 between the first and second slot contact plugs C1, C2, the gap between the third and fourth slot contact plugs C3, C4 and the gap between the fifth and sixth slot contact plugs C5, C6 would not be restricted by the limitation of the exposure machine. Accordingly, the first and second slot contact plugs C1, C2 can be disposed to cross the second active region AR2 and the third active region AR3 respectively.

Moreover, the SRAM layout structure 200 further includes a first metal-zero layer M0 and a second inter-layer dielectric layer 220 which are disposed on the contact layer C. The metal-zero layer M0 that is used to provide corresponding electrical connection of the slot contact plugs and the gate lines is disposed in a through hole of the second inter-layer dielectric layer 220. Specifically, the metal-zero layer M0 includes a first metal-zero interconnect M01 and a second metal-zero interconnect M02. The first metal-zero interconnect M01 is disposed on and in contact with the first slot contact plug C1 and the second gate line GL2, such that the drain of the first pull-down transistor PD1 and the drain of the first pull-up transistor PU1 both electrically connected to the first slot contact plug C1 can be electrically connected to the second gate line GL2 which represents the gate of the second pull-down transistor PD2 and the gate of the second pull-up transistor PU2. Please noted that an end of the first slot contact plug C1 crossing the second active region AR2 also crosses an end of the first metal-zero interconnect M01 and cover the end of the first metal-zero interconnect M01, and preferably, the end of the first metal-zero interconnect M01 may crosses the first slot contact plug C1, such that a contact area between the first metal-zero interconnect M01 and the first slot contact plug C1 may be larger, thereby reducing the contact resistance therebetween. Further, the first metal-zero interconnect M01 extends along the first direction D1 to cover an end of the second gate line GL2 serving as the gate of the second pull-up transistor PU2 and to cross the end. Accordingly, the contact area between the first metal-zero interconnect M01 and the second gate line GL2 can be raised to reduce the contact resistance between them. Therefore, the relative position between the first metal-zero interconnect M01 and the first slot contact plug C1 and the relative position between the first metal-zero interconnect M01 and the second gate line GL2 are designed to effectively reduce the contact resistance therebetween, thereby decreasing the resistance between the output of the first inverter IN1 and the input of the second inverter IN2.

Since the first SRAM unit 100a disposed at left side of the second SRAM unit 100b and near the second SRAM unit 100b is mirror-symmetric to the second SRAM unit 100b, the first SRAM unit 100a further includes a sixth gate line GL6 and a sixth metal-zero interconnect M06, and the sixth gate line GL6 and the sixth metal-zero interconnect M06 are symmetric to the second gate line GL2 and the first metal-zero interconnect M01 with respect to the second direction D2. The sixth gate line GL6 which forms a gate of the fourth pull-up transistor PU4 of the first SRAM unit 100a crosses the third active region AR3 and the fourth active region AR4 and are parallel to the second gate line GL2. The sixth gate line GL6 and the second gate line GL2 are arranged along the first direction D1. The sixth metal-zero interconnect M06 is disposed in the metal-zero layer M0 on the sixth gate line GL6 and is electrically connected to the sixth gate line GL6. The first metal-zero interconnect M01 and the sixth metal-zero interconnect M06 have a sixth gap G6 therebetween; and, the second gate line GL2 (that is the gate of the second pull-up transistor PU2) and the sixth gate line GL6 (that is the gate of the fourth pull-up transistor PU4) have a seventh gap G7. In this embodiment, the first metal-zero interconnect M01 and the sixth metal-zero interconnect M06 near the first metal-zero interconnect M01 can be defined through various photomasks combined with a double patterning process or a multiple patterning process, such that the sixth gap G6 can be smaller than the seventh gap G7. Not only the contact resistance between the metal-zero layer M0 and the gate lines can be reduced, but also the first SRAM unit 100a and the second SRAM unit 100b can be arranged more densely.

Similarly, the second metal-zero interconnect M02 is disposed on and in contact with the second slot contact plug C2 and the first gate line GL1, such that the drain of the second pull-down transistor PD2 and the drain of the second pull-up transistor PU2 both electrically connected to the second slot contact plug C2 can be electrically connected to the first gate line GL1 which represents the gate of the first pull-down transistor PD1 and the gate of the first pull-up transistor PU1. An end of the second slot contact plug C2 crossing the third active region AR3 also crosses an end of the second metal-zero interconnect M02 and cover the end of the second metal-zero interconnect M02, and preferably, the end of the second metal-zero interconnect M02 may crosses the second slot contact plug C2, such that a contact area between the second metal-zero interconnect M02 and the second slot contact plug C2 may be larger, thereby reducing the contact resistance therebetween. Further, the second metal-zero interconnect M02 extends along the first direction D1 to cover an end of the first gate line GL1 serving as the gate of the first pull-up transistor PU1 and to cross the end. Accordingly, the contact area between the second metal-zero interconnect M02 and the first gate line GL1 can be raised to reduce the contact resistance between them. Therefore, the relative position between the second metal-zero interconnect M02 and the second slot contact plug C2 and the relative position between the second metal-zero interconnect M02 and the first gate line GL1 are designed to effectively reduce the contact resistance therebetween, thereby decreasing the resistance between the output of the second inverter IN2 and the input of the first inverter IN1. Also, the first metal-zero interconnect M01 and the second metal-zero interconnect M02 have a third gap G3 therebetween, and the first gap G1 is smaller than the third gap G3.

Since the third SRAM unit 100c disposed at right side of the second SRAM unit 100b and near the second SRAM unit 100b is mirror-symmetric to the second SRAM unit 100b, the third SRAM unit 100c further includes a fifth gate line GL and a fifth metal-zero interconnect M05, and the fifth gate line GL5 and the fifth metal-zero interconnect M05 are symmetric to the first gate line GL1 and the second metal-zero interconnect M02 with respect to the second direction D2. The fifth gate line GL5 which forms a gate of the third pull-up transistor PU3 of the third SRAM unit 100c crosses the first active region AR1 and the second active region AR2 and are parallel to the first gate line GL1. The fifth gate line GL5 and the first gate line GL1 are arranged along the first direction D1. The fifth metal-zero interconnect M05 is disposed in the metal-zero layer M0 on the fifth gate line GL5 and is electrically connected to the fifth gate line GL5. The second metal-zero interconnect M02 and the fifth metal-zero interconnect M05 have a fourth gap G4 therebetween; and, the first gate line GL1 (that is the gate of the first pull-up transistor PU1) and the fifth gate line GL5 (that is the gate of the third pull-up transistor PU3) have a fifth gap G5. The second metal-zero interconnect M02 and the fifth metal-zero interconnect M05 near the second metal-zero interconnect M02 can be defined through various photomasks combined with a double patterning process or a multiple patterning process, such that the fourth gap G4 can be smaller than the fifth gap G5.

The metal-zero layer M0 may further include a third metal-zero interconnect M03 and a fourth metal-zero interconnect M04. The third metal-zero interconnect M03 that is disposed on the third gate line GL3 is in contact with the third gate line GL3 and crosses the third gate line GL3, such that the third metal-zero interconnect M03 can electrically connect the gate of the first pass-gate transistor PG1 to the word line WL. The fourth metal-zero interconnect M04 that is disposed on the fourth gate line GL4 is in contact with the fourth gate line GL4 and crosses the fourth gate line GL4, such that the fourth metal-zero interconnect M03 can electrically connect the gate of the second pass-gate transistor PG2 to the word line WL.

In addition, the first SRAM unit 100a may further include a seventh gate line GL7 and a seventh metal-zero interconnect M07, in which the seventh gate line GL7 is disposed corresponding to the third gate line GL3 and the seventh metal-zero interconnect M07 is disposed corresponding to the third metal-zero interconnect M03. An eighth gap G8 between the third metal-zero interconnect M03 and the seventh metal-zero interconnect M07 is smaller than a ninth gap G9 between the third gate line GL3 and the seventh gate line GL7. Likewise, the third SRAM unit 100c may further include an eighth gate line GL8 and an eighth metal-zero interconnect M08, in which the eighth gate line GL8 is disposed corresponding to the fourth gate line GL4 and the eighth metal-zero interconnect M08 is disposed corresponding to the fourth metal-zero interconnect M04. A tenth gap G10 between the fourth metal-zero interconnect M04 and the eighth metal-zero interconnect M08 is smaller than an eleventh gap G11 between the fourth gate line GL4 and the eighth gate line GL8.

In the present invention, the word line, the bit line, the high power line and the low power line are disposed on the metal-zero layer and the second inter-layer dielectric layer, and a plurality of inter-metal dielectric (IMD) layers, for example IMD1, ILM2 . . . , etc., may be disposed between the word line, the bit line, the high power line and the low power line and the metal-zero layer and the second inter-layer dielectric layer. Metal layers disposed on the IMD layers are sequentially referred to as metal-level one (M1) layer and metal-level two (M2) layer, and so on. The metal-level one layer is disposed in the through hole of the IMD1; the metal-level two layer is disposed in the through hole of the IMD2; and so on. Through the metal-level one layer or metal-level two layer, the transistors can be electrically connected to the desired devices or circuits. The metal interconnect of the present invention may be any one of the metal layers or the stacked layers thereof.

In conclusion, in the SRAM unit structure and layout structure, the gap between any two of the metal-zero interconnects of the metal-zero layer near each other in the first direction can be reduced to be smaller than the gap between the gate lines adjacent to each other and arranged in the first direction. Also, the slot contact plugs cross the metal-zero interconnects connected thereto. Accordingly, the contact areas between the metal-zero interconnects and the gate lines and the contact areas between the slot contact plugs and the metal-zero interconnects can be increased. Therefore, the resistance of the route for electrically connecting each transistor to another corresponding transistor can be decreased, and the SRAM units near each other can be arranged more densely.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. A static random access memory layout structure, comprising:
   a semiconductor substrate, comprising:
      a first active region extending along a first direction;
      a second active region extending along the first direction;
      a third active region extending along the first direction; and
      a fourth active region extending along the first direction, wherein the first active region, the second active region, the third active region and the fourth active region sequentially arranged along a second direction;
   a first gate line crossing the first active region and the second active region and extending to cover an end of the third active region;
   a second gate line crossing the third active region and the fourth active region and extending to cover an end of the second active region, wherein the first gate line and the second gate line extend along the second direction respectively and are parallel to each other;
   a first slot contact plug disposed between the first gate line and the second gate line and crossing the first active region and the second active region;
   a second slot contact plug disposed between the first gate line and the second gate line and crossing the third active region and the fourth active region, wherein the first slot contact plug and the second slot contact plug are arranged along the second direction and disposed between the first gate line and the second gate line;
   a first metal-zero interconnect disposed on the first slot contact plug and the second gate line and electrically connecting the first slot contact plug to the second gate line, wherein the first slot contact plug and the first metal-zero interconnect cross each other;
   a second metal-zero interconnect disposed on the second slot contact plug and the first gate line and electrically connecting the second slot contact plug to the first gate line, wherein the second slot contact plug and the second metal-zero interconnect cross each other; and a fifth gate line and a fifth metal-zero interconnect, wherein the fifth gate line is symmetric to the first gate line with respect to the second direction, and the fifth metal-zero interconnect is symmetric to the second metal-zero interconnect with respect to the second direction, and wherein the second metal-zero interconnect and the fifth metal-zero interconnect have a fourth gap therebetween, the first gate line and the fifth gate line have a fifth gap therebetween, and the fourth gap is smaller than the fifth gap.

2. The static random access memory layout structure according to claim 1, wherein the first metal-zero interconnect covers an end of the second gate line, and the second metal-zero interconnect covers an end of the first gate line.

3. The static random access memory layout structure according to claim 1, wherein the first slot contact plug covers an end of the first metal-zero interconnect, and the second slot contact plug covers an end of the second metal-zero interconnect.

4. The static random access memory layout structure according to claim 1, further comprising:
a third gate line crossing the first active region, wherein the first slot contact plug is disposed between the first gate line and the third gate line; and
a third metal-zero interconnect disposed on the third gate line and crossing the third gate line.

5. The static random access memory layout structure according to claim 1, further comprising:
a fourth gate line crossing the fourth active region, wherein the second slot contact plug is disposed between the second gate line and the fourth gate line; and
a fourth metal-zero interconnect disposed on the fourth gate line and crossing the fourth gate line.

6. The static random access memory layout structure according to claim 1, further comprising a sixth gate line and a sixth metal-zero interconnect, wherein the sixth gate line is symmetric to the second gate line with respect to the second direction, and the sixth metal-zero interconnect is symmetric to the first metal-zero interconnect with respect to the second direction, wherein the first metal-zero interconnect and the sixth metal-zero interconnect have a sixth gap therebetween, the second gate line and the sixth gate line have a seventh gap therebetween, and the sixth gap is smaller than the seventh gap.

7. The static random access memory layout structure according to claim 1, further comprising:
a third slot contact plug disposed on the first active region, wherein the first gate line is disposed between the first slot contact plug and the third slot contact plug, and the third slot contact plug is electrically connected to a low power line; and
a fourth slot contact plug disposed on the second active region, wherein the first gate line is disposed between the first slot contact plug and the fourth slot contact plug, and the fourth slot contact plug is electrically connected to a high power line.

8. The static random access memory layout structure according to claim 1, further comprising:
a fifth slot contact plug disposed on the fourth active region, wherein the second gate line is disposed between the second slot contact plug and the fifth slot contact plug, and the fifth slot contact plug is electrically connected to a low power line; and
a sixth slot contact plug disposed on the third active region, wherein the second gate line is disposed between the second slot contact plug and the sixth slot contact plug, and the sixth slot contact plug is electrically connected to a high power line.

9. The static random access memory layout structure according to claim 1, wherein the first slot contact plug and the second slot contact plug have a first gap therebetween, the second active region and the third active region have a second gap therebetween, the first gap is smaller than the second gap, the first metal-zero interconnect and the second metal-zero interconnect have a third gap therebetween, and the first gap is smaller than the third gap.

10. A static random access memory layout structure, comprising:
a semiconductor substrate, comprising:
a first active region extending along a first direction;
a second active region extending along the first direction;
a third active region extending along the first direction; and
a fourth active region extending along the first direction, wherein the first active region, the second active region, the third active region and the fourth active region sequentially arranged along a second direction;
a first gate line crossing the first active region and the second active region and extending to cover an end of the third active region;
a second gate line crossing the third active region and the fourth active region and extending to cover an end of the second active region, wherein the first gate line and the second gate line extend along the second direction respectively and are parallel to each other;
a first slot contact plug disposed between the first gate line and the second gate line and crossing the first active region and the second active region;
a second slot contact plug disposed between the first gate line and the second gate line and crossing the third active region and the fourth active region, wherein the first slot contact plug and the second slot contact plug are arranged along the second direction and disposed between the first gate line and the second gate line, wherein the first slot contact plug and the second slot contact plug have a first gap therebetween and the second active region and the third active region have a second gap therebetween, and the first gap is smaller than the second gap;
a first metal-zero interconnect disposed on the first slot contact plug and the second gate line and electrically connecting the first slot contact plug to the second gate line, wherein the first slot contact plug extends to cross an end of the first metal-zero interconnect;
a second metal-zero interconnect disposed on the second slot contact plug and the first gate line and electrically connecting the second slot contact plug to the first gate line, wherein the second slot contact plug extends to cross an end of the second metal-zero interconnect, the first metal-zero interconnect and the second metal-zero interconnect have a third gap therebetween, and the first gap is smaller than the third gap;
a third slot contact plug disposed on the first active region, wherein the first gate line is disposed between the first slot contact plug and the third slot contact plug, and the third slot contact plug is electrically connected to a low power line; and
a fourth slot contact plug disposed on the second active region, wherein the first gate line is disposed between the first slot contact plug and the fourth slot contact plug, and the fourth slot contact plug is electrically connected to a high power line.

* * * * *